United States Patent [19]

Spencer, Jr.

[11] 3,965,390
[45] June 22, 1976

[54] POWER ON DEMAND BEAM DEFLECTION SYSTEM FOR CRT DISPLAYS

[75] Inventor: James M. Spencer, Jr., Phoenix, Ariz.

[73] Assignee: Sperry Rand Corporation, New York, N.Y.

[22] Filed: Feb. 21, 1975

[21] Appl. No.: 551,795

[52] U.S. Cl............................... 315/397; 315/387; 315/389
[51] Int. Cl.$^2$......................................... H01J 29/70
[58] Field of Search ............ 315/396, 397, 387, 389

[56] References Cited
UNITED STATES PATENTS

| | | | |
|---|---|---|---|
| 3,628,083 | 12/1971 | Holmes et al. | 315/387 |
| 3,863,099 | 1/1975 | Owens, Jr. | 315/387 |
| 3,887,842 | 6/1975 | Owens, Jr. et al. | 315/397 |

*Primary Examiner*—Maynard R. Wilbur
*Assistant Examiner*—G. E. Montone
*Attorney, Agent, or Firm*—Howard P. Terry; Seymour Levine

[57] ABSTRACT

A cathode ray tube linear beam deflection system capable of operation over a wide range of beam deflection rates providing automatic power supply voltage switching to maintain linear operation and provide minimum power dissipation. Information for the automatic switching is obtained by continuously monitoring the yoke voltage, the power supply voltage being switched to a voltage of higher magnitude when the yoke voltage exceeds a predetermined level and returned to the power supply voltage of lower magnitude when the higher magnitude voltage is no longer required.

7 Claims, 2 Drawing Figures

POWER ON DEMAND BEAM DEFLECTION SYSTEM FOR CRT DISPLAYS

BACKGROUND OF THE INVENTION

1. Field of the Invention

This invention relates to cathode ray tube electron beam deflection control systems and more particularly to electronic circuits which provide increased beam deflection rates with a minimum increase of power dissipation while maintaining linear beam deflection operation.

2. Description of the Prior Art

Beam deflection systems used in the prior art for linear deflection across the screen of a cathode ray tube generally employ amplifiers, the input signal to which is representative of the desired beam deflection, to provide an amplified voltage to the deflection yoke of the cathode ray tube which causes a current to flow through the yoke and a sample resistor in series therewith. The yoke current flowing through the sample resistor produces a voltage waveform representative of the deflection current. The voltage developed across the sample resistor is then subtracted from the amplifier input signal, establishing an amplfied error signal. Another voltage is developed across the sample resistor as a result of the error signal amplification and is subtracted from the input signal, which further reduces the error signal. Reduction of the error signal results in a reduction in the yoke voltage which changes the yoke current to track the desired input voltage waveform. This feedback voltage is used to control the deflection current in a linear and accurate manner with any change in the input signal being transformed into an equivalent current change in the deflection yoke. Proper design of this system results in a transconductance amplfier which provides a yoke current that is directly proportional to the input voltage.

This technique has proven to be quite effective for deflection systems with moderate beam deflection rate requirements. When an increase in the input signal establishes a deflection rate not within the linear range of the system, the amplifier will saturate and the yoke current will increase at a rate determined by the L/R time constant, of the yoke and sample resistor, and the saturation voltage. The amplifier is then operating open loop and cannot control the output current until the feedback voltage achieves a level at which it can regain control. Previous solutions to this problem increased the power supply or lowered the inductance of the yoke, both of which increases the power dissipation of the system. Other solutions established mode selectable dual voltage operation. However, this approach is limited to operations in which the modes are periodic and easily definable. The present invention provides for automatic switching of the supply voltages when required and results in linear beam deflection over an increased range of beam deflection rates with a minimum increase in power requirements.

SUMMARY OF THE INVENTION

A cathode ray tube beam deflection system embodying the principles of the present invention comprises a deflection preamplifier input stage, a push-pull output stage cascaded with the input stage with its output coupled to the deflection yoke of the system, a voltage sensor in each section of the push-pull output stage which senses the voltage output of each section and provides a signal representative of this output, and a power switch for each section of the output stage which switches from a potential of a lower magnitude to one of a higher magnitude when the output transistor of the output stage approaches saturation and back to the lower potential magnitude when the increased potential magnitude is no longer required. A sampling resistor is connected in series with the coil for providing a negative feedback voltage, at the input of the deflection preamplifier, which is proportional to the coil current.

During the operation of one section of the push-pull output stage, the voltage sensor senses the output voltage of the output stage and provides a signal representative of this voltage to the power switch. When this signal reaches a predetermined level, representative of the saturation level of the transistor, the power switch automatically switches the power supply voltage of the output transistor, of the push-pull section in operation, to a voltage with a greater magnitude. This permits the transistor to provide an output voltage with a greater magnitude which allows for an increased rate of change of the deflection coil current. In this manner, the amplifier continues to operate in a linear mode and complete feedback control is assured. The greater magnitude voltage level is maintained until the error signal at the input of the deflection preamplifier no longer tends to drive the output stages into saturation. Thus an improvement in the amplifier's ability to increase the rate of change of the beam deflection is accomplished, with little power increase, while maintaining linear operation. Only one supply is switched at a time and then only for the amount of time actually required to accomplish the desired rate of change of beam deflection.

DESCRIPTION OF THE PREFERRED EMBODIMENT

Figure 1:
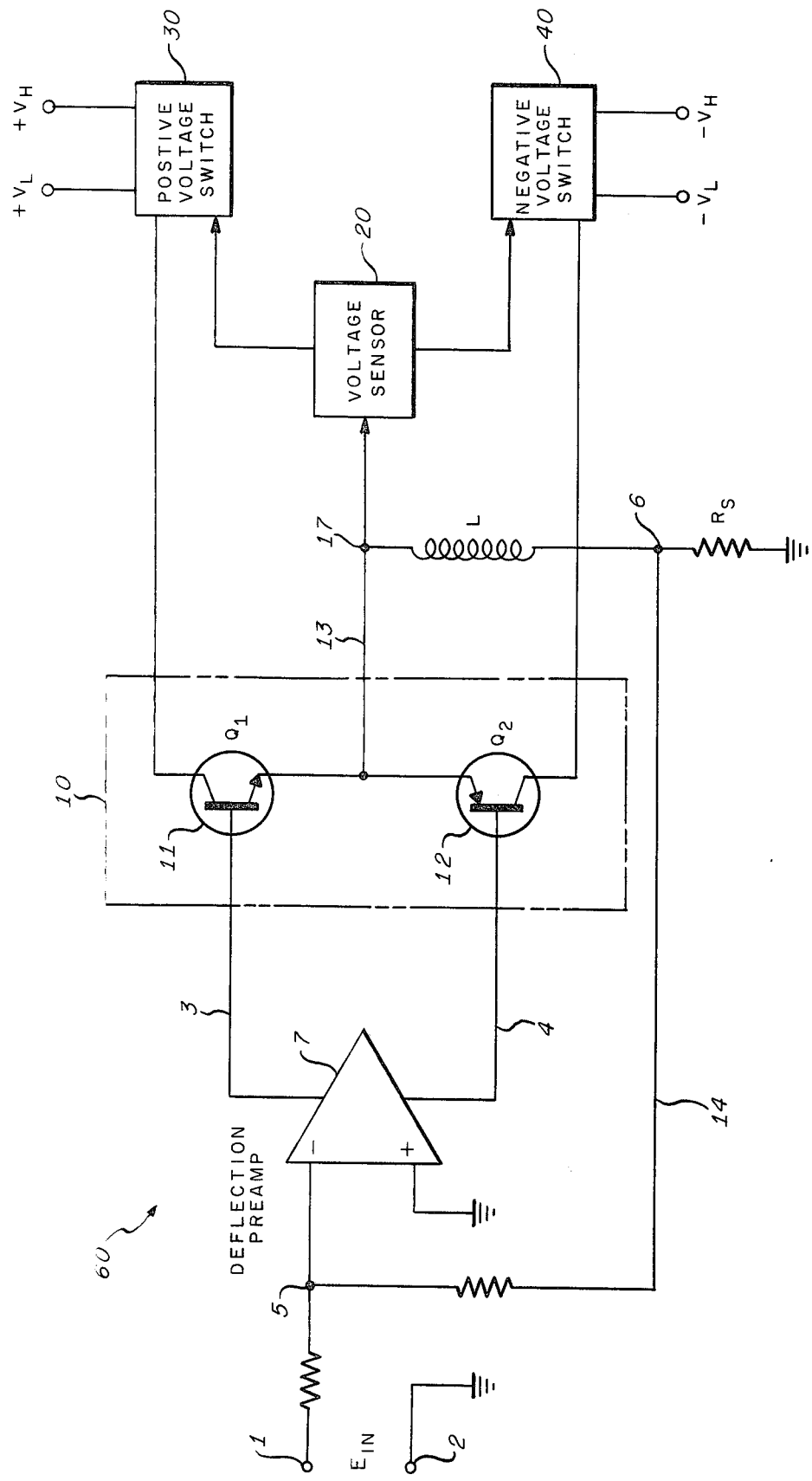
FIG. 1 is a block diagram of a linear deflection amplifier incorporating the automatic power switching of the invention.

Referring to FIG. 1 a power on demand beam deflection system 60 includes an input stage deflection preamplifier 7, a push-pull output stage 10 having emitter-followers Q1 and Q2, voltage sensor 20, a positive voltage switch 30, a negative voltage switch 40, a deflection yoke L on the cathode ray tube (CRT) not shown, and a yoke current sampling resistor $R_s$. An input signal $E_{in}$ representative of the desired beam deflection is applied at terminals 1 and 2. This voltage is amplified by the deflection preamplifier 7 which provides an amplified voltage to the push-pull output stage 10. Push-pull output stage 10 operates in a conventional manner, one emitter-follower Q1 being conductive for a positive polarity of the output of the deflection preamplifier 7, which appears on conductor 3, and the other emitter-follower Q2 being conductive for a negative polarity of the output of the deflection preamplifier 7, which appears on conductor 4. The outputs of the amplifiers of push-pull stage 10 are coupled together and the resulting output appears at the output conductor 13 of output stage 10. Only one of the switches 30 and 40 operates at a time and the operation of the positive and negative sections of the combination of output stage 10, voltage sensor 20 and power switches 30 or 40 are similar. Consequently, for each of understanding and simplicity of description, only the operation of the positive section will be described.

Positive voltage outputs of deflection preamplifier 7 are applied to base 11 of transistor Q1 via conductor 3. Transistor Q1 serves to buffer this voltage and provides current gain to drive the deflection yoke L via conductor 13. The voltage at output conductor 13 is then applied to yoke L causing current to flow therethrough and through current sample resistor $R_s$. The current flowing through sample resistor $R_s$ produces a voltage at node 6, the point of interconnection of yoke L and resistor $R_s$. This voltage is fed back via conductor 14 to node 5 where it is subtracted from the input signal $E_{in}$ producing an error voltage. This process continues until the error voltage is reduced to a level, which is referred to as the normal error voltage, that results in an output voltage on output conductor 13 that produces a current through yoke L which linearly tracks the desired input signal $E_{in}$. If the error voltage at node 5 cannot be reduced to this level, transistor Q1 saturates and the current flowing through yoke L increases at a rate determined by the saturation voltage and the L/R time constant of the yoke L and resistor $R_s$ until the voltage across $R_s$ produces a normal error voltage at node 5. The voltage existing on conductor 13 is applied to voltage sensor 20 at node 17. This voltage is proportional to the desired rate of change of the beam deflection and as it increases, transistor Q1 approaches saturation. The output of voltage sensor 20 is applied to power switch 30 where it is compared to a reference level representing a voltage which indicates that transistor Q1 is approaching saturation. While the voltage sensor 20 output is below this reference level, positive power supply voltage $V_L$ is applied to transistor Q1. When this reference level is exceeded, power switch 30 switches the power supply voltage from voltage source $+V_L$ to a voltage source of greater magnitude $+V_H$. This switch allows transistor Q1 to have a greater output, thus allowing for a greater range of normal error voltages, and results in an increased rate of change of beam deflection while maintaining linear operation. The amplifier continues to operate in a linear manner and precise feedback control of the amplifier is maintained. When the error signal at node 5 is reduced so as to be within the desired normal error voltage limits for amplifier operation with power supply voltage $+V_L$, the voltage at node 17 is decreased and the voltage sensor 20 informs power switch 30 to reset the power supply voltage to the lower magnitude $+V_L$.

Figure 2:
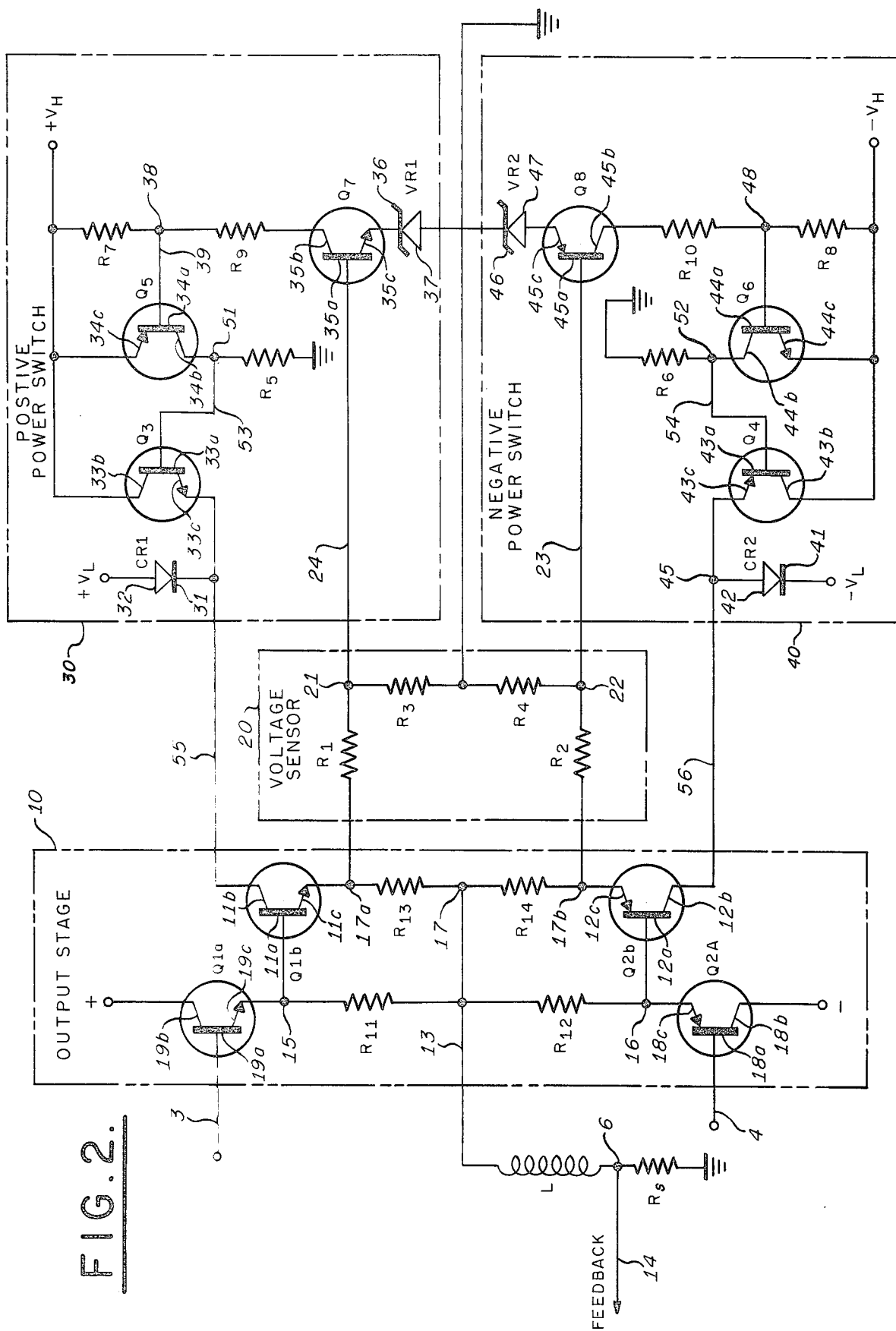
FIG. 2 is an electrical circuit schematic diagram illustrative of a preferred embodiment of the invention.

FIG. 2 illustrates a more detailed schematic of a preferred embodiment of the invention beginning at the outpput of the preamplifier. Output stage 10 is a multi-stage push-pull amplifier in which one section comprises NPN transistors Q1a and Q1b and the other section comprises PNP transistors Q2a and Q2b. The output of this push-pull amplifier appears at node 17 and output conductor 13 which is coupled to one end of resistor $R_s$ through yoke L, the other end of resistor $R_s$ couples to ground. The base 19a of transistor Q1a and the base 18a of transistor Q2a are coupled to the positive and negative outputs, respectively, of the deflection preamplifier, not shown. The emitter 19c of transistor Q1a and the base 11a of transistor Q1b are coupled at node 15 which coupled to node 17 via resistor $R_{11}$, while the collector 19b couples to a positive d.c. source not shown. The base 12a of transistor Q2b couples to the emitter 18c of transistor Q2a at node 16 which coupled to node 17, via resistor $R_{12}$, while collector 18b of transistor Q2a couples to a negative d.c. source not shown. The emitter 11c of transistor Q1b couples to one end of resistor $R_1$ of voltage sensor 20 at node 17a which couples to node 17 via resistor $R_{13}$. The other end of resistor $R_1$ is coupled to one end of resistor $R_3$ of voltage sensor 20 at node 21, the other end of which is coupled to ground. Resistors $R_1$ and $R_3$ comprising a voltage divider, the output of which appears at node 21. The collector 11b of transistor Q1b couples to positive voltage switch 30 at node 35 via conductor 55. The emitter 12c of transistor Q2b is coupled to one end of the resistor $R_2$ of voltage sensor 20 at node 17b which couples to node 17 via resistor $R_{14}$. The other end of resistor $R_2$ is coupled to one end of resistor $R_4$, of voltage sensor 20, at node 22, the other end of which is coupled to ground. Resistors $R_2$ and $R_4$ comprising a voltage divider, the output of which appears at node 22. The collector 12b of transistor Q2b is coupled to negative voltage switch 40 at node 45 via conductor 56. Node 36 of positive power switch 30 couples to the emitter 33c of NPN transistor Q3 and to the cathode 31 of a diode CR1, the anode 32 of which couples to a low positive voltage source indicated as $+V_L$. The base 33a of transistor Q3 is coupled to the collector 34b of PNP transistor Q5 and one end of resistor $R_5$ at node 51 via conductor 53, the other end of resistor $R_5$ couples to ground. The collector 33b of transistor Q3 couples to a high positive voltage source indicated as $+V_H$. The emitter 34c of transistor Q5 couples to voltage source $+V_H$ while the base 34a couples to one end of resistors $R_7$ and $R_9$ at node 38 via conductor 39. The other end of resistor $R_7$ couples to voltage source $+V_H$ while the other end of resistor $R_9$ couples to the collector 35b of NPN transistor Q7. The base 35a of transistor Q7 couples to output node 21, of voltage sensor 20, via output conductor 24, of voltage sensor 20, while the emitter 35c is coupled to the cathode 36 of a Zener diode VR1, the anode 37 of which is coupled to ground. Node 45 couples to the emitter 43c of PNP transistor Q4 and to the anode 42 of a diode CR2, the cathode 41 of which couples to a negative voltage source of low magnitude indicated as $-V_L$. The base 43a of transistor Q4 couples to the collector 44b of NPN transistor Q6 and to one end of resistor $R_6$ at node 52 via conductor 54. The other end of resistor $R_6$ couples to ground. The collector 43b of transistor Q4 couples to a negative voltage source of high magnitude indicated as $-V_H$. The emitter 44c of transistor Q6 also couples to voltage source $-V_H$ and the base 44a of transistor Q6 couples to one end of resistors $R_8$ and $R_{10}$ at node 48 via conductor 49. The other end of resistor $R_8$ couples to voltage source $-V_H$ while the other end of resistor $R_{10}$ couples to collector 45b of PNP transistor Q8. Base 45a of transistor Q8 couples to output node 22, of voltage sensor 20, via output conductor 23, of voltage sensor 20, and the emitter 45c couples to the anode 47 of the Zener diode VR2, the cathode 46 of which couples to ground.

Positive voltage switch 30 and negative voltage switch 40 operate in a similar manner and provide minimum power dissipation by the operation of all transistors which form the switch in either the saturated or cut-off modes. Consequently, only a detailed description of the operation of positive voltage switch 30 will be given. When the signal on output conductor 3 of deflection preamplfier 7 of FIG. 1 is of insufficient magnitude to drive transistor Q1b of FIG. 2 into saturation, transistors Q3, Q5 and Q7 are all non-conducting and voltage source $+V_L$ is supplied to the collector $11b$ of transistor $Q1b$, via diode CR1 which is forward-biased. As the error signal at node 5, FIG. 1, increases, the voltage at node $17a$, FIG. 2, increases increasing the voltage at node 21, of voltage sensor 20. The voltage at node 21 is applied to the base $35a$ of transistor Q7 via output conductor 24, of voltage sensor 20. The voltage at the base $35a$ increases until at some critical value, determined by Zener diode VR1, which indicates that transistor $Q1b$ is approaching saturation, transistor Q7 conducts. When transistor Q7 conducts, current flows through the resistors $R_7$ and $R_9$ reducing the voltage at node 38, thus reducing the base $34a$ voltage of transistor Q5 via conductor 39. This voltage reduction causes transistor Q5 to conduct, which in turn causes the voltage at node 51 to increase towards the positive voltage source $+V_H$. This voltage is coupled to the base $33a$ of transistor Q3, via conductor 53 turning transistor Q3 on, which then saturates and provides the higher voltage source $+V_H$ to node 35 back-biasing diode CR1, thus removing low voltage source $+V_L$ from the collector $11b$, of transistor $Q1b$, and supplying the higher voltage source $+V_H$ thereto. As the error signal at node 5, FIG. 1, is reduced, the voltage at node $17a$ is then reduced, which in turn decreases the voltage at the base $35a$ of transistor Q7 to a voltage below the critical value, rendering transistor Q7 non-conductive. This in turn increases the voltage at node 38 to voltage souce $+V_H$ rendering transistor Q5 non-conductive, decreasing the voltage at node 51 which in turn renders transistor Q3 non-conductive, thus removing voltage source $+V_H$ from node 35, re-establishing the forward-bias of diode CR1 and providing voltage source $+V_L$ to node 35 and to the collector $11b$ of transistor $Q1b$ via conductor 55.

Although the invention has been described as a switching device between two voltages, as will be noted by those skilled in the art, it could easily be extended to include a multiplicity of voltage sources and switches to insure linear operation of an amplifier over an extended range of input signals.

While the invention has been described in its preferred embodiment, it is to be understood that the words which have been used are words of description rather than limitation and that changes may be made within the purview of the appended claims without departing from the true scope and spirit of the invention in its broader aspects.

I claim:

1. In an electron beam deflection control system including a deflection coil and a deflection amplifier wherein the deflection amplifier comprises, input means for receiving an input signal indicative of the desired deflection of the beam for providing an output signal in response to said input signal;

output means having first and second push-pull operated sections, responsive to said output signal of said input means, each section providing an output, each output coupled to an output lead through which control current is applied to a common output terminal which is coupled to said deflection coil; said first section being responsive to a predetermined polarity of said output signal from said input means and said second section being responsive to a polarity opposite to said predetermined polarity, for controlling current through said deflection coil to provide a desired rate of change of beam deflection in one direction or the other in accordance with the polarity of said output signal of said input means, sensing means containing a first section and a second section responsive to said outputs of said first and second sections respectively of said output means for providing a sensed output signal representative of each output of said output means;

a multiplicity of voltage sources of a first polarity, a multiplicity of voltage sources of a second polarity which is opposite to said first polarity; and switching means containing a first and a second section, coupled to said first and second sections respectively of said sensing means and said output means, said first section of said switching means coupled to said multiplicity of voltage sources of said first polarity and said second section of said switching means coupled to said multiplicity of voltage sources of said second polarity, for switching from a voltage source of one of said polarities to a voltage source of greater magnitude and the same polarity when said output signal of said sensing means exceeds a critical magnitude, and from a voltage source of one of said polarities to a voltage source of lesser magnitude and the same polarity when the magnitude of said output signal of said sensing means is below said critical magnitude thereby a supply voltage of sufficient magnitude is provided to said output means which allows sufficient current to flow through said deflection coil to accomplish the desired rate of change of beam deflection while maintaining linear operation of said output means.

2. In the system of claim 1 wherein said first and second push-pull operated sections each include a plurality of cascaded transistors connected such that the last transistor of each section has its emitter coupled to said sensing means and to said deflection coil and its collector coupled to said switching means.

3. In the system of claim 2 wherein each section of said switching means comprises, reference means coupled to said sensing means for establishing a reference voltage level representative of said critical magnitude; and switching control means, coupled to said reference means, which performs the switching from a voltage source of said multiplicity of voltage sources and of one of said polarities to a voltage source of greater magnitude and the same polarity whenever the magnitude of said output of said sensing means exceeds the magnitude of said reference level and from a voltage source of said multiplicity of voltage sources and of one of said polarities to a voltage source of a lesser magnitude and the same polarity whenever the magnitude of said output of said sensing means does not exceed the magnitude of said reference level.

4. In the system of claim 3 wherein:

each section of said sensing means comprises a voltage divider containing an input and an output, each input coupled to the emitter of the last transistor of the corresponding section of said push-pull sections and each output coupled to the corresponding section of said switching means.

5. In the system of claim 3 wherein said switching control means comprises, a unidirectional current element having a first end and a second end, said first end coupled to the collector of said last transistor of one of said push-pull sections and said second end coupled to a first voltage of said multiplicity of voltage sources of one of said polarities and poles to provide said first voltage at the collector of said last transistor when current is conducted therethrough;

a plurality of transistors, having a first transistor and a last transistor, coupled to a second voltage of said multiplicity of voltage sources of the same polarity as said first voltage, said second voltage being of greater magnitude than said first voltage, wherein the emitter of the last transistor of said plurality of transistors couples to said first end of said unidirectional element and to the collector of said last transistor of said push-pull section and the base of said first transistor couples to said output of said sensing means; and reference means, coupled to the emitter of said first transistor of said plurality of transistors for establishing a reference voltage level representative of said critical magnitude, said first transistor being in a non-conducting state when the magnitude of said output signal of said sensing means is below said critical magnitude, and in a conducting state when said critical magnitude is exceeded at said output of said sensing means thereby causing said first transistor to conduct current, whereby other transistors of said plurality of transistors conduct current, causing said last transistor to saturate, thereby switching said potential source of greater magnitude to said collector of said last transistor of said output stage and back-biasing said unidirectional element, thus removing potential source of lesser magnitude from said collector.

6. In the system of claim 5 wherein said reference means comprises a Zener diode.

7. In the system of claim 6 including an impedance coupled in series with said deflection coil for providing a voltage representative of the current flowing therethrough, said voltage to be fed back to said input of said input stage for comparison with said input signal to derive an error signal equal to the difference between said input and feedback signals for controlling the current supplied by said deflection amplifier.

* * * * *